United States Patent
Yoon

(10) Patent No.: US 12,316,248 B2
(45) Date of Patent: May 27, 2025

(54) WIND POWER GENERATOR USING PIEZOELECTRIC ELEMENT

(71) Applicant: Hyeong Do Yoon, Seoul (KR)

(72) Inventor: Hyeong Do Yoon, Seoul (KR)

( * ) Notice: Subject to any disclaimer, the term of this patent is extended or adjusted under 35 U.S.C. 154(b) by 839 days.

(21) Appl. No.: 17/546,824

(22) Filed: Dec. 9, 2021

(65) Prior Publication Data

US 2022/0190746 A1 Jun. 16, 2022

(30) Foreign Application Priority Data

Dec. 10, 2020 (KR) .................. 10-2020-0172157

(51) Int. Cl.
*H02N 2/18* (2006.01)
(52) U.S. Cl.
CPC .............. *H02N 2/186* (2013.01); *H02N 2/185* (2013.01)
(58) Field of Classification Search
CPC .......... H02N 2/185; H02N 2/186; F03D 5/00; F05B 2220/709
See application file for complete search history.

(56) References Cited

U.S. PATENT DOCUMENTS

| 2017/0237368 A1* | 8/2017 | Zhang ............... H02N 2/18 |
| | | 310/339 |
| 2022/0038034 A1* | 2/2022 | Gooneratne .......... H02N 2/181 |
| 2022/0416691 A1* | 12/2022 | Podval .................. H02N 2/186 |

FOREIGN PATENT DOCUMENTS

| KR | 20130000311 A | * | 1/2013 |
| KR | 20130009583 A | * | 1/2013 |
| KR | 102462727 B1 | * | 11/2022 |

* cited by examiner

*Primary Examiner* — Jaydi San Martin
(74) *Attorney, Agent, or Firm* — Hauptman Ham, LLP

(57) ABSTRACT

The present disclosure relates to a wind power generator using a piezoelectric element. A wind power generator using a piezoelectric element according to an embodiment of the present disclosure, includes: a plurality of panels which are sequentially stacked, a wing-shaped piezoelectric member disposed between the plurality of panels for generating electrical energy by external force and a vibrating ball container disposed on one surface of the wing-shaped piezoelectric member and including a plurality of vibrating balls, wherein a hole through which wind can pass is formed in at least one surface of the vibrating ball container.

11 Claims, 15 Drawing Sheets

WIND POWER GENERATOR USING PIEZOELECTRIC ELEMENT

CROSS-REFERENCE TO RELATED APPLICATIONS

This application claims the priority of Korean Patent Application No. 10-2020-0172157 filed on Dec. 10, 2020, in the Korean Intellectual Property Office, the disclosure of which is hereby incorporated by reference in its entirety.

BACKGROUND

1. Technical Field

The present disclosure relates to a wind power generator using a piezoelectric element including a multi-layered panel through which wind passes in the front, rear, left, right, up and down directions, a wing-shaped piezoelectric member disposed between the panels, a vibrating ball container which arranges vibrating balls around the center of a wing-shaped piezoelectric member, and an assembly stand.

2. Description of the Related Art

A wind power generator refers to a device that converts the kinetic energy of wind into mechanical energy and then converts mechanical energy into electric energy.

A wind power generator is greatly affected by the surrounding environment, and the efficiency of power generation varies according to the direction and strength of the wind.

On the other hand, a conventional wind power generator commercialized for power supply using blade rotation has a problem in that the blade rotation of the wind power generator is stopped when the strength of the wind is weaker than the minimum wind strength capable of rotating the blades of the wind generator.

In addition, when the direction and strength of the wind are irregularly changed, the conventional wind power generator cannot efficiently generate electric energy in response thereto.

In addition, since the conventional wind power generator generates electric energy by driving only a blade, if an abnormality occurs in the blade, there is a problem in that generation of the electric energy is stopped.

SUMMARY

An object of the present disclosure is to provide a wind power generator using a piezoelectric element capable of generating electric energy by placing the vibrating ball and the vibrating ball container arranging the vibrating ball on the top of the wing-shaped piezoelectric member, so that the vibrating ball reacts even when the wind strength is weak.

An object of the present disclosure is to provide a wind power generator using a piezoelectric element capable of generating electric energy by arranging a wing-shaped piezoelectric member between the panels to generate irregular vibration, i.e., buffeting, when the direction and strength of the wind change.

An object of the present disclosure is to provide a wind power generator using a piezoelectric element capable of generating electric energy at various locations by arranging a wing-shaped piezoelectric member disposed between the panels in a plurality of layers and a plurality of sections, and even if an abnormality occurs at a specific section, the generation of electrical energy is not stopped.

A wind power generator using a piezoelectric element according to an embodiment of the present disclosure, includes: a plurality of panels which are sequentially stacked, a wing-shaped piezoelectric member disposed between the plurality of panels for generating electrical energy by external force and a vibrating ball container disposed on one surface of the wing-shaped piezoelectric member and including a plurality of vibrating balls, wherein a hole through which wind can pass is formed in at least one surface of the vibrating ball container.

In one embodiment of the present disclosure, the wing-shaped piezoelectric member includes a central hole, a plurality of wings, a piezoelectric element disposed on the surface of a wing, and a wiring.

In one embodiment of the present disclosure, a protrusion is formed in a lower portion of a corner of each panel, and a seating portion is formed in an upper portion of a corner of each panel.

In one embodiment of the present disclosure, the vibrating ball container includes a cylindrical outer wall, a cylindrical inner wall, a lower surface, and a ring.

In one embodiment of the present disclosure, the vibrating ball container includes an accommodating space formed by the cylindrical outer wall, the cylindrical inner wall and the lower surface, and a plurality of vibrating balls are accommodated in the accommodating space.

In one embodiment of the present disclosure, a plurality of holes are formed in the cylindrical outer wall or the lower surface, and the vibrating ball vibrates by the wind passing through the plurality of holes.

In one embodiment of the present disclosure, the wind power generator further includes: an assembly stand on which the plurality of panels, the wing-shaped piezoelectric member, and the vibrating ball are stacked.

In one embodiment of the present disclosure, the assembly stand includes a support plate and a column pipe arranged in the center of the support plate.

In one embodiment of the present disclosure, the column pipe includes a wiring outlet through which the wiring passes.

In one embodiment of the present disclosure, the plurality of panels, the wing-shaped piezoelectric member, and the vibrating ball are stacked on an upper portion of the support plate, and a printed circuit board to which wiring is connected is disposed inside the support plate.

In one embodiment of the present disclosure, a seating portion for fixing the protrusions of the plurality of panels is formed at an upper portion of the corner of the support plate, and a hole to which a bolt is fastened is formed in the center of the seating portion.

When the wind power generator using the piezoelectric element according to the embodiments of the present disclosure is used, the vibrating ball and the vibrating ball container for arranging the vibrating ball are disposed on the wing-shaped piezoelectric member so that the vibrating ball reacts even when the strength of the wind is weak, thereby electrical energy can be generated.

When the wind power generator using the piezoelectric element according to the embodiments of the present disclosure is used, by arranging a wing-shaped piezoelectric member between the panels to generate irregular vibration, i.e., buffeting, when the wind direction and strength change, so that electric energy can be continuously generated.

When the wind power generator using the piezoelectric element according to the embodiments of the present disclosure is used, a wing-shaped piezoelectric member disposed between the panels is arranged in a plurality of layers and a plurality of sections, and even if an abnormality occurs at a specific section, the generation of electrical energy is not stopped.

The effects of the present disclosure can not limited thereto but other effects can be apparent from following descriptions.

DETAILED DESCRIPTION

Figure 1:
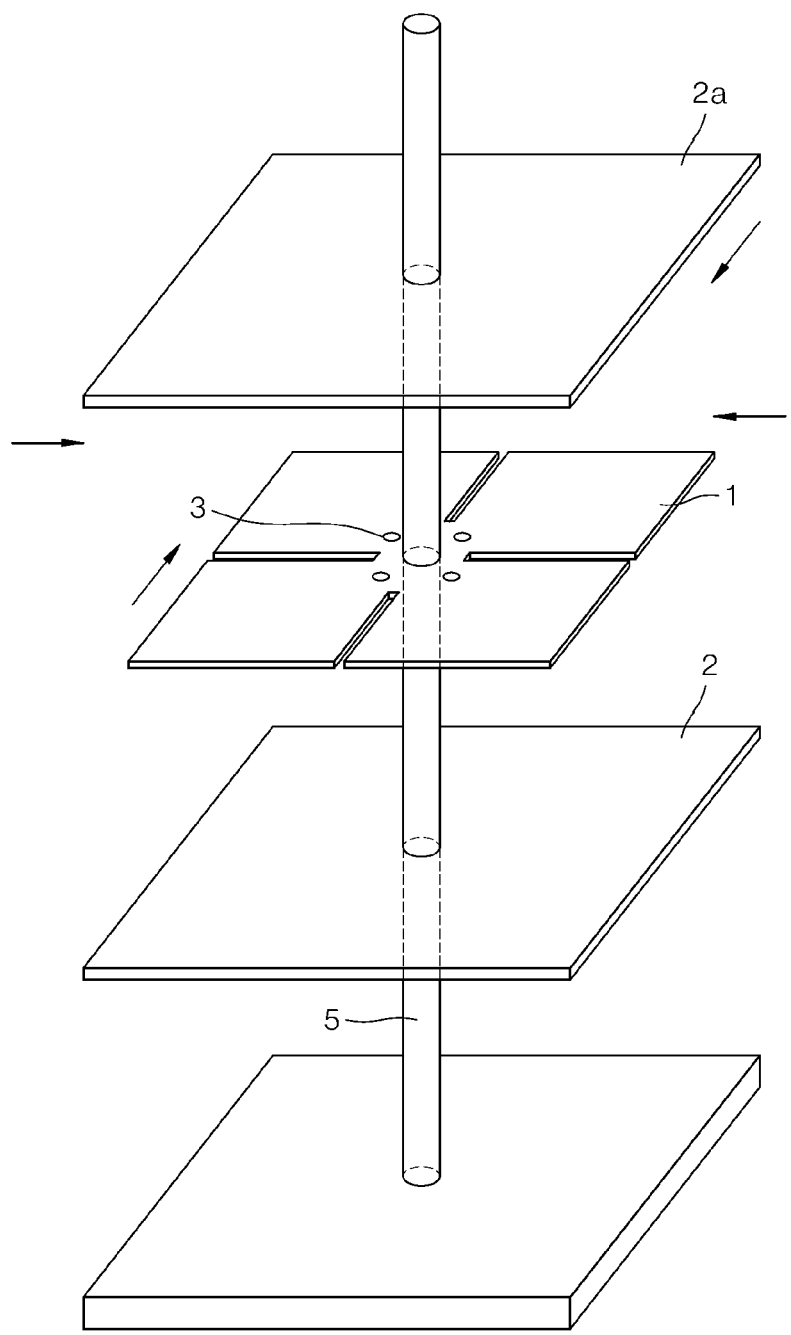
FIG. 1 shows a wind power generator using a piezoelectric element according to an embodiment of the present disclosure.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations can be omitted in order not to unnecessarily obscure the gist of the present disclosure. Hereinafter, embodiments of the present disclosure will be described in detail with reference to the accompanying drawings. Throughout the drawings, like reference numerals refer to like elements.

FIG. 1 shows a wind power generator using a piezoelectric element according to an embodiment of the present disclosure.

Referring to FIG. 1, a wind power generator using a piezoelectric element according to an embodiment of the present disclosure includes an assembly stand 5, a first panel 2, a wing-shaped piezoelectric member 1, and a second panel 2a. As shown in FIG. 1, the first panel 2, the wing-shaped piezoelectric member 1, and the second panel 2a are sequentially stacked around the assembly stand 5.

A plurality of vibrating balls 3 are arranged around the center of the wing-shaped piezoelectric member 1. When wind having an irregular direction and strength passes through the wing-shaped piezoelectric member 1, electric energy can be continuously generated by vibration of the vibrating ball 3.

In one embodiment of the present disclosure, the first panel 2, the wing-shaped piezoelectric member 1, and the second panel 2a are sequentially stacked around the assembly stand 5 to form a unit structure. Therefore, the wind power generator using a piezoelectric element according to an embodiment of the present disclosure can have a multi-layered structure in which a plurality of unit structures are stacked.

In addition, since the wind power generator according to an embodiment of the present disclosure has a symmetrical structure on the front, rear, left, and right sides, electric energy can be continuously generated even in an environment in which the wind direction is irregularly changed.

Hereinafter, a structure of a wind power generator using a piezoelectric element according to an embodiment of the present disclosure and an electric energy generation process according to an operation of the wind power generator will be described in detail.

For reference, in an embodiment of the present disclosure, the strength or direction of the wind can change irregularly. A strong wind that is instantaneously generated by such wind fluctuations is called gust, and the irregular vibration of an object caused by the gust is called gust response.

As shown in FIG. 1, when two or more structures such as the second panel 2a and the wing-shaped piezoelectric member 1 are arranged adjacently, on the second panel 2a, which is a structure on the upper side, the disturbed airflow is transmitted to the wing-shaped piezoelectric member 1 which is a structure on the lower side, and irregular vibrations are generated in the wing-shaped piezoelectric member 1.

Such irregular vibration is called buffeting. Due to buffeting, spontaneous polarization occurs in the wing-shaped piezoelectric member 1 to generate electric energy. The wind transmitted to the wing-shaped piezoelectric member 1 is also transmitted to the vibrating ball 3 arranged on the wing-shaped piezoelectric member 1. Accordingly, when the vibrating ball 3 vibrates, a force is applied to the wing-shaped piezoelectric member 1 to generate electric energy.

That is, according to an embodiment of the present disclosure, a wing-shaped piezoelectric member is disposed between the panels 2 and 2a. According to this arrangement, when the direction and strength of the wind is changed, irregular vibration, buffeting, is generated so that the piezoelectric element itself vibrates or the vibrating ball vibrates. Electric energy can be continuously generated by the vibration of the piezoelectric element or by a force transmitted to the piezoelectric element by the vibration of the vibrating ball.

Figure 2:
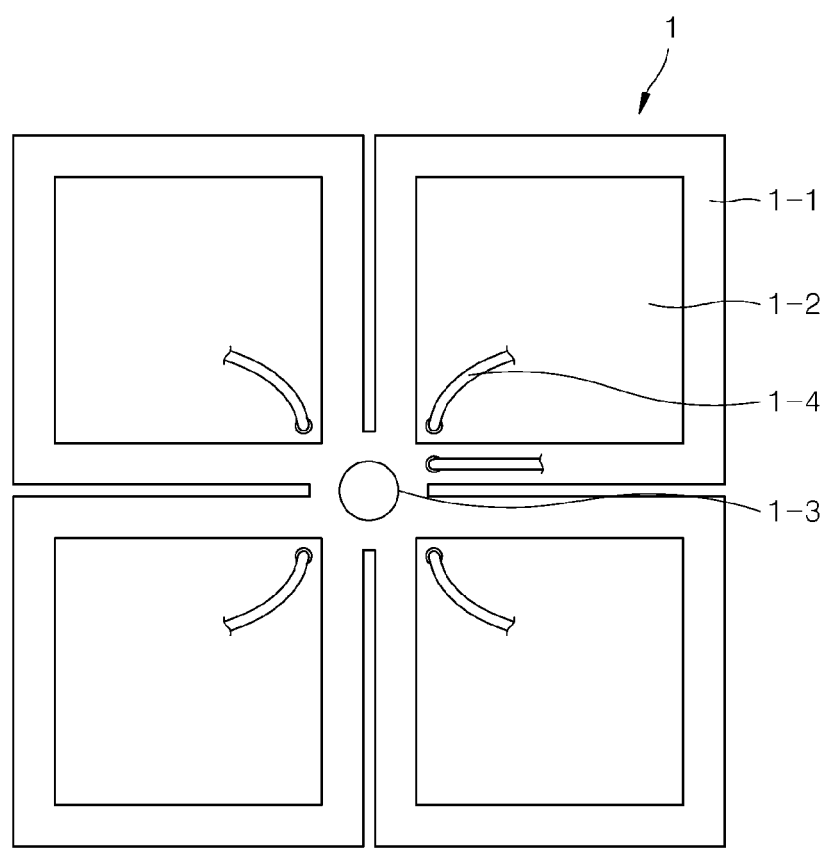
FIG. 2 is a plan view illustrating a wing-shaped piezoelectric member of a wind power generator using a piezoelectric element according to an embodiment of the present disclosure.
Figure 3:
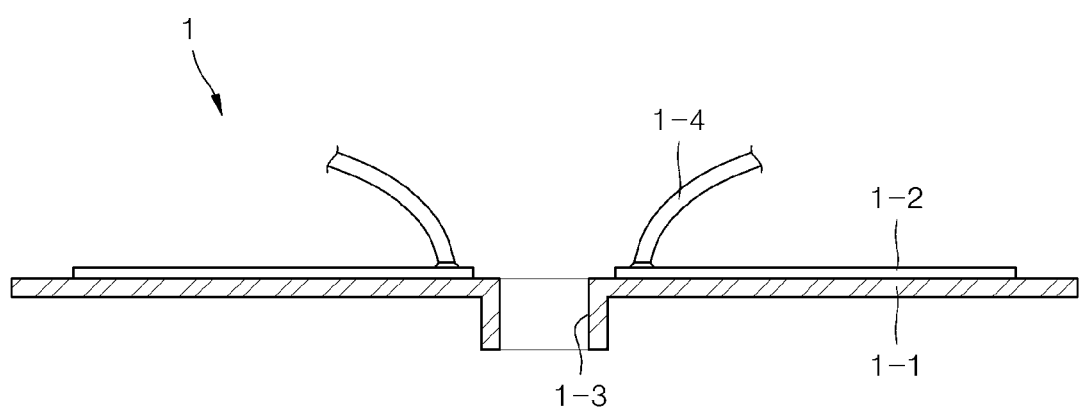
FIG. 3 is a cross-sectional view illustrating a wing-shaped piezoelectric member of a wind power generator using a piezoelectric element according to an embodiment of the present disclosure.

FIG. 2 is a plan view illustrating a wing-shaped piezoelectric member of a wind power generator using a piezoelectric element according to an embodiment of the present disclosure. FIG. 3 is a cross-sectional view illustrating a wing-shaped piezoelectric member of a wind power generator using a piezoelectric element according to an embodiment of the present disclosure.

As illustrated in FIG. 2 and FIG. 3, the wing-shaped piezoelectric member 1 is formed by forming a center hole 1-3 and four wings 1-1 on a single piece of metal, and by bonding the piezoelectric element 1-2 to the surface of wings 1-1 and soldering the wiring 1-4. FIG. 2 and FIG. 3 illustrate an embodiment in which the shape of the wing-shaped piezoelectric member 1 is a rectangle and the wing-shaped piezoelectric member 1 includes four wings 1-1, but the shape of the wing-shaped piezoelectric member 1 and the number of wings included in the wing-shaped piezoelectric member 1 can be different depending in other embodiments.

The wing-shaped piezoelectric member 1 is a member capable of converting the force applied by the vibrating ball disposed on the wing-shaped piezoelectric member 1 into electrical energy by using a piezoelectric phenomenon. Electric energy can be generated by vibrating the wing-shaped piezoelectric member 1 itself by wind.

The central hole 1-3 is a space into which the column pipe 5-2 of the assembly stand 5 to be described later is inserted. The wiring 1-4 transfers the electric energy generated by the wing-shaped piezoelectric member 1 to another device. The wiring 1-4 can be arranged through the wiring outlet 5-3 formed in the column pipe 5-2 of the assembly stand 5 to be described later.

Figure 4:
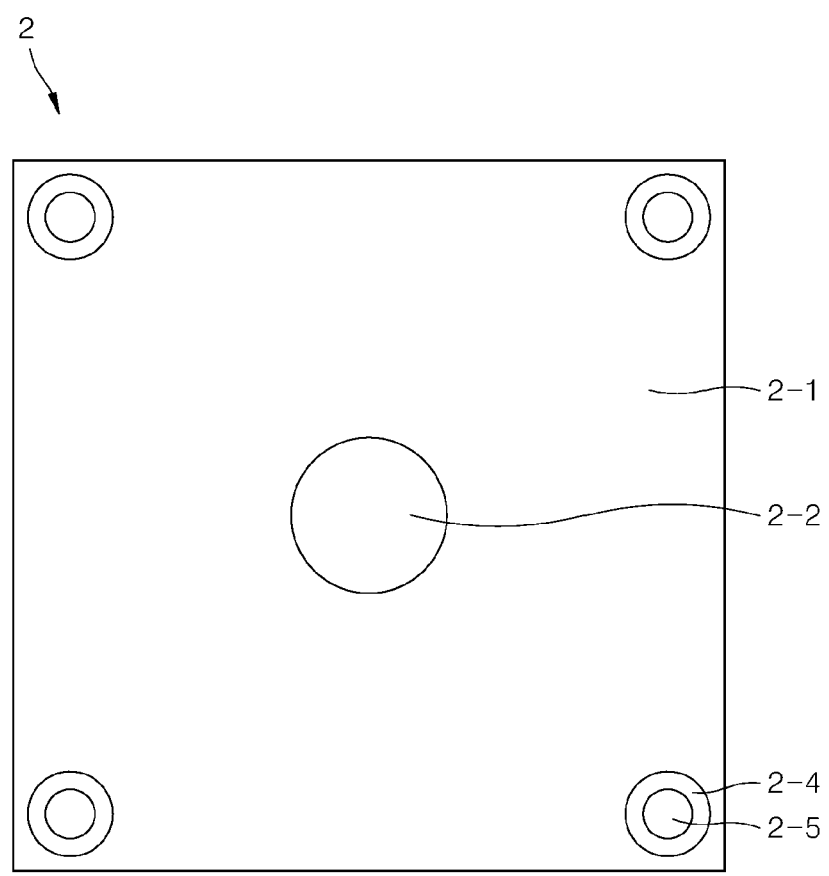
FIG. 4 is a plan view illustrating a panel of a wind power generator using a piezoelectric element according to an embodiment of the present disclosure.
Figure 5:
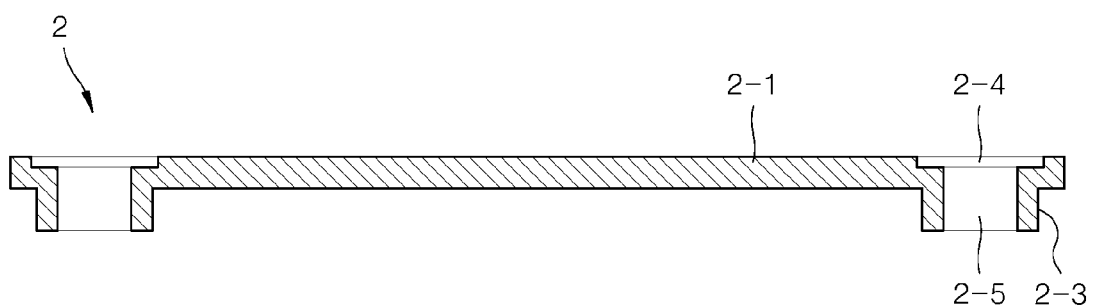
FIG. 5 is a cross-sectional view illustrating a panel of a wind power generator using a piezoelectric element according to an embodiment of the present disclosure.

FIG. 4 is a plan view illustrating a panel of a wind power generator using a piezoelectric element according to an embodiment of the present disclosure. FIG. 5 is a cross-sectional view illustrating a panel of a wind power generator using a piezoelectric element according to an embodiment of the present disclosure. Although the structure of the first panel 2 is illustrated in FIG. 4 and FIG. 5, the second panel 2a or another panel can have the same structure as the first panel 2 in FIG. 4 and FIG. 5.

As illustrated in FIG. 4 and FIG. 5, the first panel 2 includes a rectangular panel 2-1 having a circular space 2-2 formed in its center. A protrusion 2-3 is formed at the lower portion of each corner of the rectangular panel 2-1, and a concave seating portion 2-4 is formed at the upper portion of each corner of the rectangular panel 2-1. A corner hole 2-5 through which the bolt 6 penetrates can be formed in the center of the seating portion 2-4 and the protrusion 2-3.

A plurality of panels 2 can be stacked to form a multi-layered structure. Since the front, rear, left, and right sides of the multi-layered panel 2 have a symmetrical structure, wind can always pass through the panel 2 even if the wind direction is changed.

Figure 6:
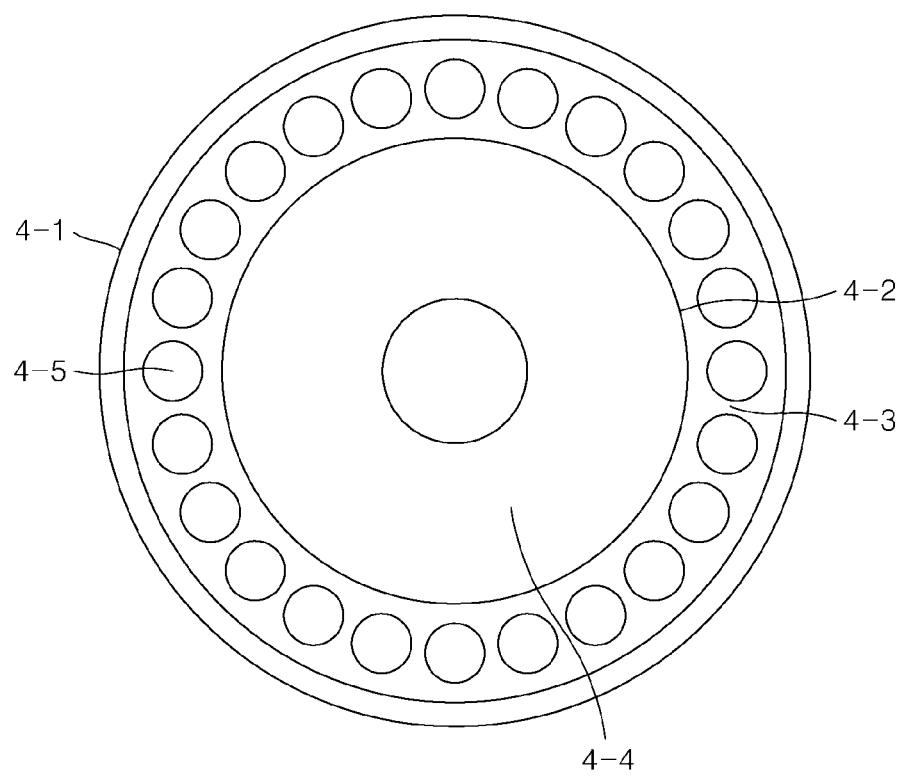
FIG. 6 is a plan view illustrating a vibrating ball container of a wind power generator using a piezoelectric element according to an embodiment of the present disclosure.
Figure 7:
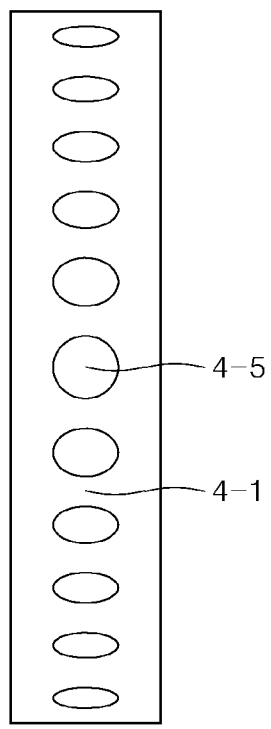
FIG. 7 is a side view illustrating a vibrating ball container of a wind power generator using a piezoelectric element according to an embodiment of the present disclosure.
Figure 8:
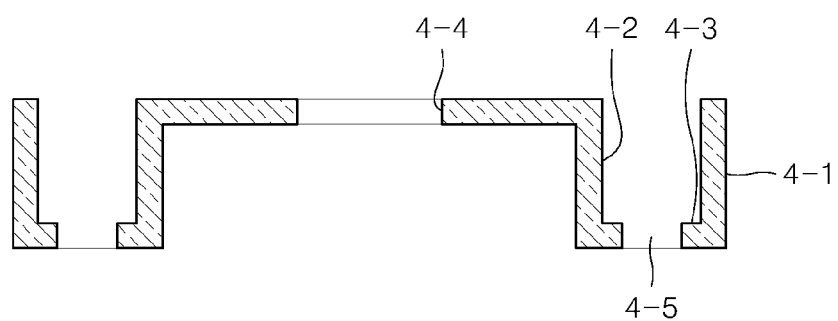
FIG. 8 is a cross-sectional view illustrating a vibrating ball container of a wind power generator using a piezoelectric element according to an embodiment of the present disclosure.

FIG. 6 is a plan view illustrating a vibrating ball container of a wind power generator using a piezoelectric element according to an embodiment of the present disclosure. FIG. 7 is a side view illustrating a vibrating ball container of a wind power generator using a piezoelectric element according to an embodiment of the present disclosure. FIG. 8 is a cross-sectional view illustrating a vibrating ball container of a wind power generator using a piezoelectric element according to an embodiment of the present disclosure.

As illustrated in FIG. 6, FIG. 7 and FIG. 8, the vibrating ball container 4 includes a cylindrical outer wall 4-1, a cylindrical inner wall 4-2, a lower surface 4-3, and a ring 4-4.

The cylindrical outer wall 4-1 and the cylindrical inner wall 4-2 are connected by the lower surface 4-3 to form a space for accommodating the vibrating ball 3. A plurality of vibration balls 3 are accommodated in the accommodating space formed by the cylindrical outer wall 4-1, the cylindrical inner wall 4-2, and the lower surface 4-3. Accordingly, a plurality of vibrating balls 3 can be arranged in an annular shape around the center of the wing-shaped piezoelectric member 1.

The column pipe 5-2 of the assembly stand 5 is inserted into the ring 4-4.

A plurality of holes 4-5 are formed in the cylindrical outer wall 4-1 or the lower surface 4-3. The diameter of each of the holes 4-5 can be smaller than the diameter of the vibrating ball 3. Accordingly, the vibrating ball 3 can not flow out of the hole 4-5 and can be seated on the lower surface 4-3.

The wind passing through the holes 4-5 formed in the cylindrical outer wall 4-1 causes the vibrating ball 3 disposed on the lower surface 4-3 to vibrate. In addition, the wind passing through the holes 4-5 formed in the lower surface 4-3 causes the vibrating ball 3 to vibrate. Accordingly, when vibration is generated while the vibrating ball 3 disposed on the lower surface 4-3 moves, a force is applied to the wing-shaped piezoelectric member 1 by the vibrating ball 3, and accordingly the wing-shaped piezoelectric member 1 can generate electric energy.

According to an embodiment of the present disclosure, since the vibrating ball and the vibrating ball container are disposed on the wing-shaped piezoelectric member, the vibrating ball can respond to a weak wind, and thus electric energy can be generated even when the strength of the wind is weak.

Figure 9:
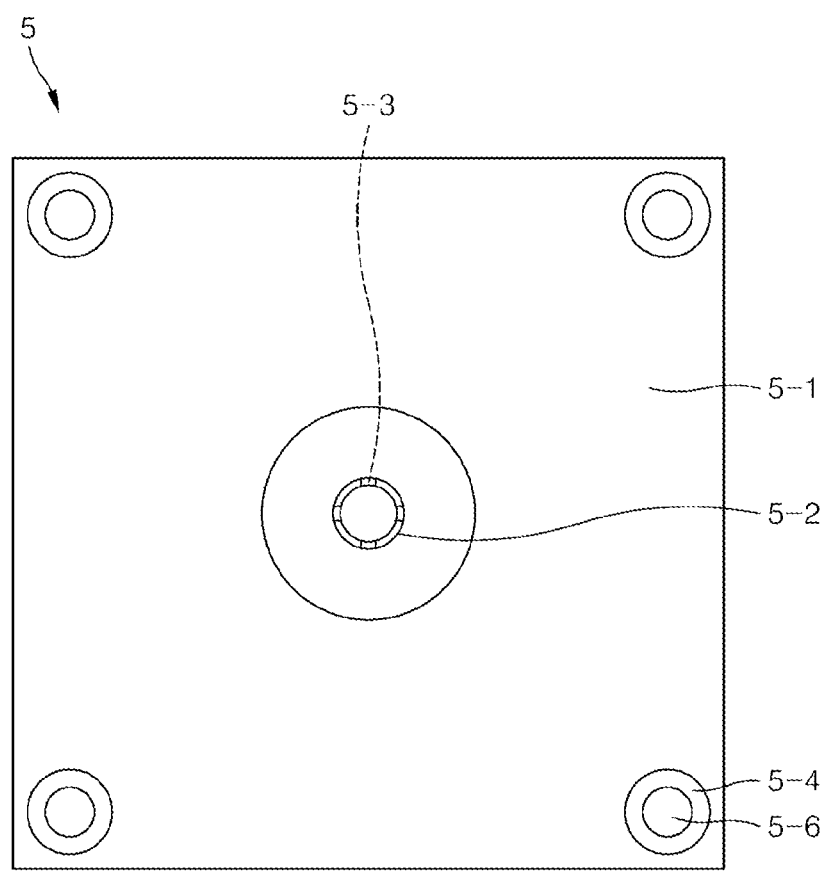
FIG. 9 is a plan view illustrating an assembly stand of a wind power generator using a piezoelectric element according to an embodiment of the present disclosure.
Figure 10:
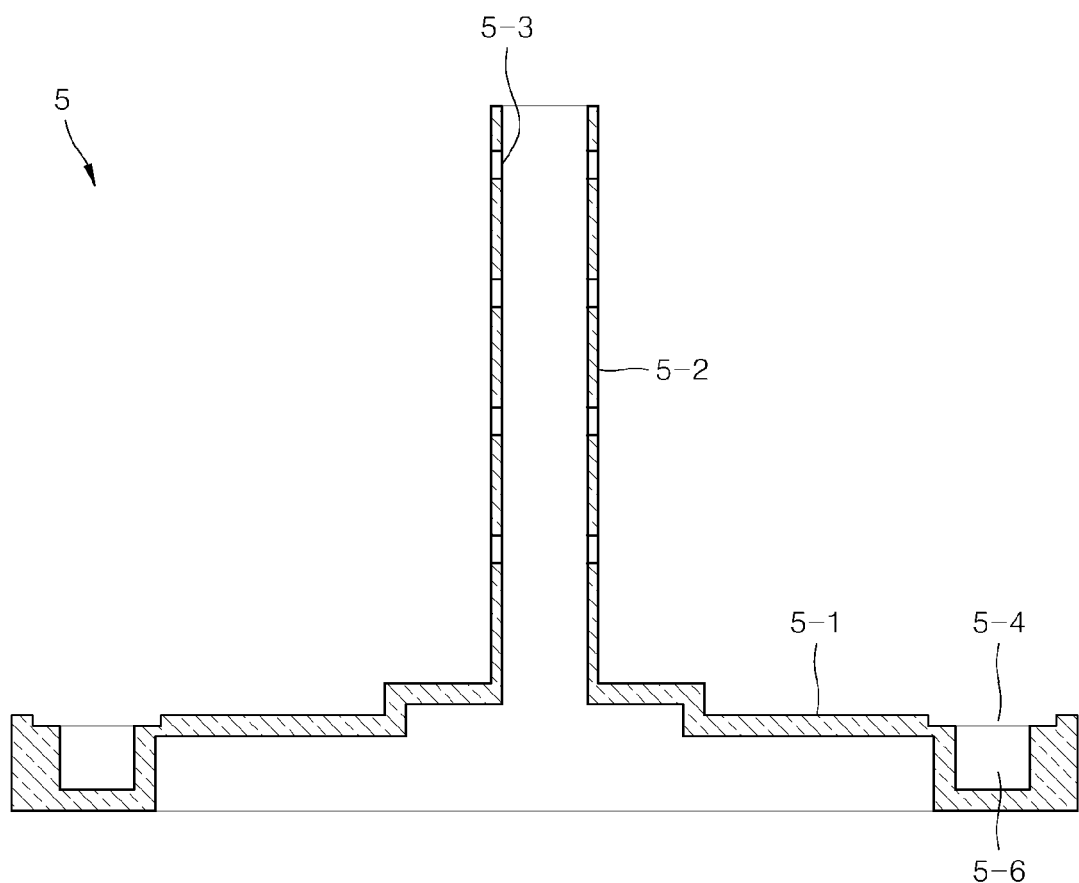
FIG. 10 is a cross-sectional view illustrating an assembly stand of a wind power generator using a piezoelectric element according to an embodiment of the present disclosure.

FIG. 9 is a plan view illustrating an assembly stand of a wind power generator using a piezoelectric element according to an embodiment of the present disclosure. FIG. 10 is a cross-sectional view illustrating an assembly stand of a wind power generator using a piezoelectric element according to an embodiment of the present disclosure.

As illustrated in FIG. 9 and FIG. 10, the assembly stand 5 includes a support plate 5-1 and a column pipe 5-2 disposed in the center of the support plate 5-1.

The wiring 1-4 of the wing-shaped piezoelectric member 1 may pass through the inside of the column pipe 5-2. In addition, the column pipe 5-2 may be inserted into the center hole 1-3 of the wing-shaped piezoelectric member 1 and the ring 4-4 of the vibrating ball container 4.

A wiring outlet 5-3 through which the wiring 1-4 can pass is formed in the column pipe 5-2.

The support plate 5-1 includes an upper surface and an inner space. The panel 2 is laminated in multiple layers on the upper surface of the support plate 5-1, and a printed circuit board to which the wirings 1-4 are connected is mounted in the inner space of the support plate 5-1.

At the corner of the upper surface of the support plate 5-1, a seating portion 5-4 for fixing the protrusion 2-3 of the panel 2 is formed. A bolt hole 5-6 to which the bolt 6 is fastened is formed in the center of the seating portion 5-4.

Figure 11:
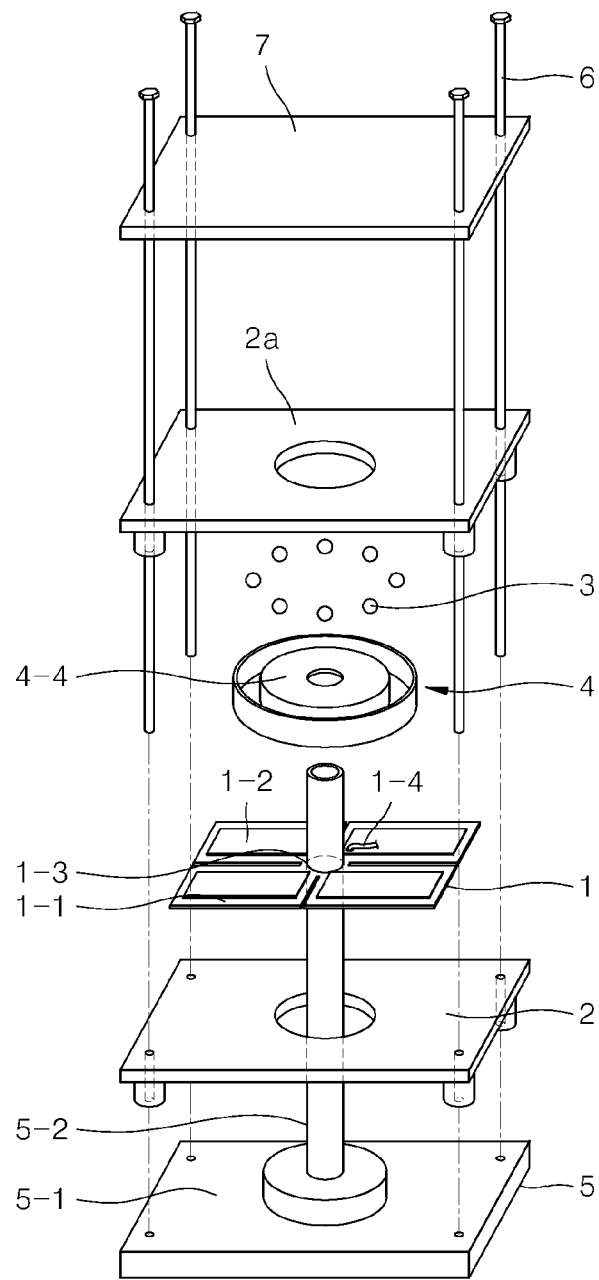
FIG. 11 is an exploded perspective view of a wind power generator using a piezoelectric element according to an embodiment of the present disclosure.

FIG. 11 is an exploded perspective view of a wind power generator using a piezoelectric element according to an embodiment of the present disclosure.

Referring to FIG. 11, the first panel 2 is stacked on the upper portion of the assembly stand 5 in one embodiment of the present disclosure. Then, the wing-shaped piezoelectric member 1 and the vibrating ball container 4 including the vibrating ball 3 is respectively stacked on the first panel 2. Next, a second panel 2a and a cover 7 are respectively stacked on the top of the vibrating ball container 4. Finally, by inserting the bolt 6, the first panel 2, the second panel 2a, and the cover 7 are fixed to the assembly stand 5.

Figure 12:
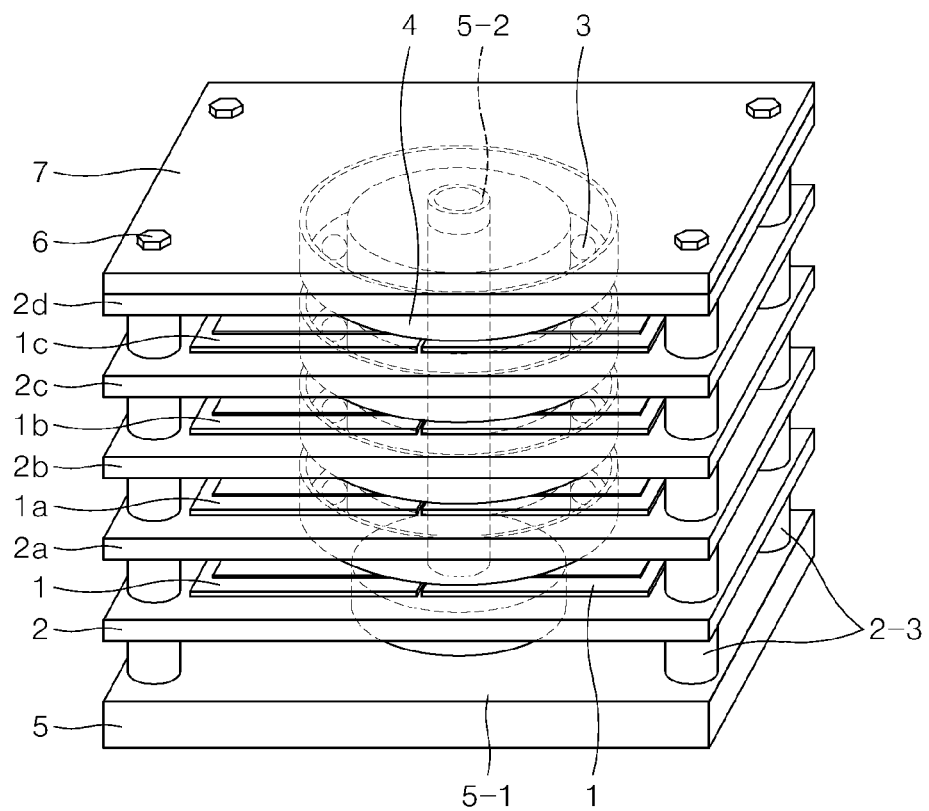
FIG. 12 is an external view of a wind power generator using a piezoelectric element according to an embodiment of the present disclosure.
Figure 13:
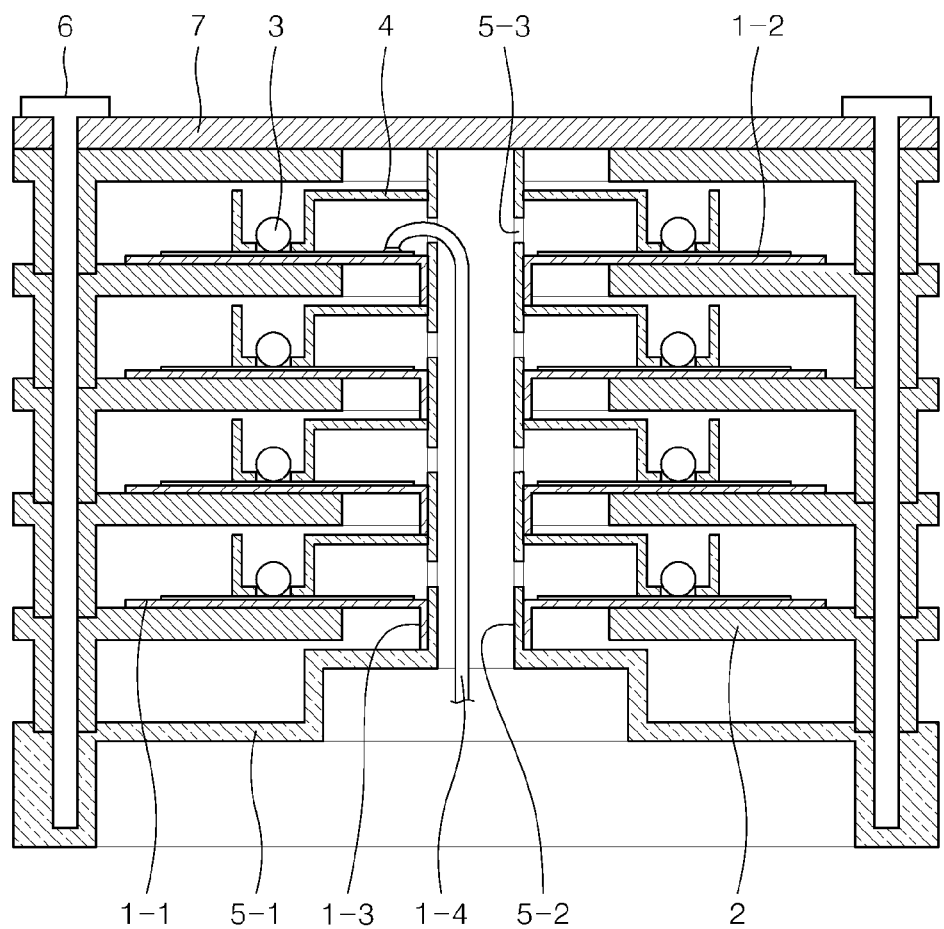
FIG. 13 is a cross-sectional view of a wind power generator using a piezoelectric element according to an embodiment of the present disclosure.

FIG. 12 is an external view of a wind power generator using a piezoelectric element according to an embodiment of the present disclosure. FIG. 13 is a cross-sectional view of a wind power generator using a piezoelectric element according to an embodiment of the present disclosure.

FIG. 12 shows an exemplary wind power generator having a four-layer structure according to an embodiment of the present disclosure. However, in another embodiment of the present disclosure, the wind power generator does not necessarily have a four-layer structure.

As shown in FIG. 12, the wing-shaped piezoelectric members 1, 1a, 1b, 1c disposed between the panels 2, 2a, 2b, 2c, 2d and the panels 2, 2a, 2b, 2c, 2d, the vibrating ball container 4, the central hole 1-3 of the wing-shaped piezoelectric member 1, and the support plate 5-1 of the assembly stand 5 are exposed to the outside, respectively.

The panel can include a first panel 2, a second panel 2a, a third panel 2b, a fourth panel 2c, and a fifth panel 2d.

The wing-shaped piezoelectric member can include a first wing-shaped piezoelectric member 1, a second wing-shaped piezoelectric member 1a, a third wing-shaped piezoelectric member 1b, and a fourth wing-shaped piezoelectric member 1c.

The plurality of wing-shaped piezoelectric members 1, 1a, 1b, and 1c can be disposed between the layers of the plurality of panels 2 to 2d.

According to the wind power generator using a piezoelectric element according to an embodiment of the present disclosure, by arranging a wing-shaped piezoelectric member between the panels, irregular vibration, i.e. buffeting, is generated when the direction and strength of the wind is changed, thus electric energy can be continuously generated.

Referring to FIGS. 1 to 13, the wind power generator can be assembled in the following exemplary order.

First, the protrusion 2-3 of the first panel 2 of the first floor is seated on the seating part 5-4 of the support plate 5-1.

Next, by inserting the central hole 1-3 of the first wing-shaped piezoelectric member 1 into the column pipe 5-2, the first wing-shaped piezoelectric member 1 is disposed on the upper portion of the first panel 2.

Next, the column pipe 5-2 is inserted into the hole of the ring 4-4 of the vibrating ball container 4. Accordingly, the vibrating ball container 4 including the vibrating ball 3 is disposed on the first wing-shaped piezoelectric member 1.

Next, the protrusion 2-3 of the second panel 2a is seated on the seating portion 2-4 of the first panel 2.

Next, by inserting the column pipe 5-2 into the central hole 1-3 of the second wing-shaped piezoelectric member 1a, the second wing-shaped piezoelectric member 1a is disposed on the upper portion of the second panel 2a.

Next, the column pipe 5-2 is inserted into the hole of the ring 4-4 of the vibrating ball container 4. Accordingly, the vibrating ball container 4 including the vibrating ball 3 is disposed on the second wing-shaped piezoelectric member 1a.

Next, the protrusion 2-3 of the third panel 2b is seated on the seating portion 2-4 of the second panel 2a.

Next, by inserting the column pipe 5-2 into the central hole 1-3 of the third wing-shaped piezoelectric member 1b, the third wing-shaped piezoelectric member 1b is disposed on the upper part of the third panel 2b.

Next, the column pipe 5-2 is inserted into the hole of the ring 4-4 of the vibrating ball container 4. Accordingly, the vibrating ball container 4 including the vibrating ball 3 is disposed on the third wing-shaped piezoelectric member 1b.

Next, the protrusion 2-3 of the fourth panel 2c is seated on the seating portion 2-4 of the third panel 2b.

Next, by inserting the column pipe 5-2 into the central hole 1-3 of the fourth wing-shaped piezoelectric member 1c, the fourth wing-shaped piezoelectric member 1c is disposed on the upper portion of the fourth panel 2c.

Next, the column pipe 5-2 is inserted into the hole of the ring 4-4 of the vibrating ball container 4. Accordingly, the vibrating ball container 4 including the vibrating ball 3 is disposed on the fourth wing-shaped piezoelectric member 1c.

Next, the cover 7 is disposed on the seating portion 2-4 of the fourth panel 2c.

Next, the cover 7, the fourth panel 2c, the third panel 2b, the second panel 2a, the first panel 2, and the support plate 5-1 are fastened with the bolt 6.

According to an embodiment of the present disclosure, by placing the vibrating ball and the vibrating ball container containing the vibrating ball on the top of the wing-shaped piezoelectric member, the vibrating ball reacts even when the strength of the wind is weak, and electric energy can be generated even when the strength of the wind is weak.

In addition, according to an embodiment of the present disclosure, a wing-shaped piezoelectric member disposed between the panels is disposed in a plurality of layers and a plurality of sections to generate electric energy at various locations, and even if an abnormality occurs at a specific section, electric energy production cannot be interrupted.

In addition, since the front, rear, left, and right surfaces of the wind power generator according to an embodiment of the present disclosure are each symmetric, the wind can pass through the piezoelectric element in any direction. Accordingly, electric energy can be continuously generated by the buffeting phenomenon and vibration of the vibrating ball on the wing-shaped piezoelectric member.

The wind power generator using the piezoelectric element of the present disclosure can be installed floatingly in the sea where the wind is generated.

In addition, it is possible to mount a wind power generator in an electric vehicle to generate electric energy from wind while driving, and to store the produced electric energy in a battery. Therefore, it is possible to reduce the inconvenience of electric vehicle drivers having to go through an electric vehicle charging station to charge electricity and the burden of electric bills for the driver.

Figure 14:
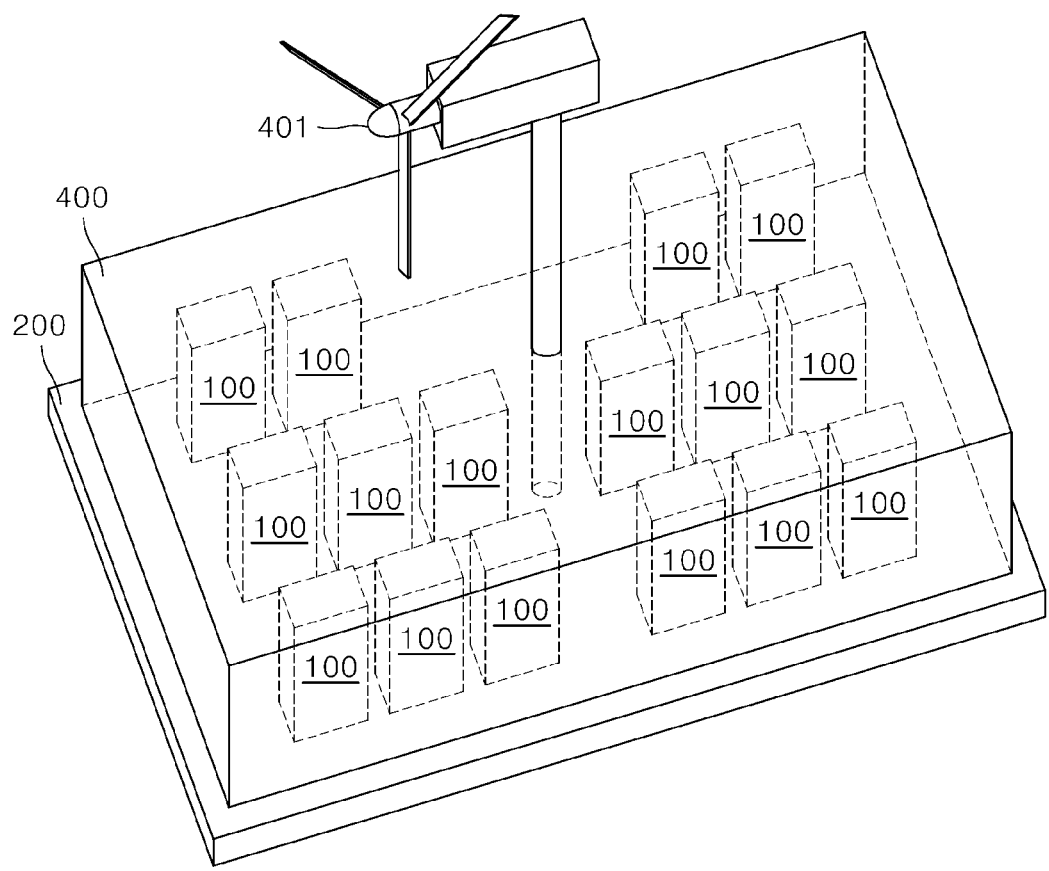
FIG. 14 shows a state in which a wind power generator using a piezoelectric element according to an embodiment of the present disclosure is installed in a floating offshore wind power plant.

FIG. 14 shows a state in which a wind power generator using a piezoelectric element according to an embodiment of the present disclosure is installed in a floating offshore wind power plant.

In one embodiment, the floating offshore wind power generation facility can include a wind power generator 100 according to an embodiment of the present disclosure, a floating platform 200, a blade-type wind power generator 401, and a ventilated waterproof cover 400.

In the case of power generation by wind power, the amount of power generation is proportional to the area of the power generation facility under the same conditions, so it is important to secure a large site for the power generation facility construction. However, when a wind power generation facility is installed on a large area, there are problems such as limitation of the installation area, difficulty in securing a place with strong wind strength, and increase in construction cost due to land compensation cost.

Offshore wind power generation can be an alternative that can solve many of these problems. Offshore wind power generation enables efficient use of land through the use of installation site by installing wind power generation facilities on the waters of idle areas such as reservoirs, rivers, dams, and the sea.

In one embodiment of the present disclosure, the offshore wind power plant can include a wind power generator 100 according to an embodiment of the present disclosure, a floating platform 200 that can be fixed to the wind power generator 100 on the upper part and can float with a floating body attached to the lower part, the ventilated waterproof cover 400 installed on the upper part of the floating platform 200 to protect the wind power generator 100 from rain, a blade-type wind power generator 300, a wire connecting an anchor fixed to the ground and a floating platform 200, a weight, a transformer converting the current generated by the wind power generator 100, and a distribution line for power transmission.

The floating platform 200 of the offshore wind power plant is fixed at a specific position to set and fix the direction of the blade wind power generator 401 according to the direction of the wind in order to increase power generation efficiency. The fixing of the floating platform 200 can be made by connecting the floating platform 200 to an anchor fixed to the ground with a wire, and adjusting the tension of the wire through a weight.

In addition, although not shown in FIG. 14, when a plurality of floating platforms 200 are installed in a matrix structure, each of the floating platforms 200 may be connected through a wire to prevent drift and to fix the position.

According to an embodiment of the present disclosure, conventional blade-type wind power generator 401 and a wind power generator 100 according to an embodiment of the present disclosure are disposed together on the floating platform 200. In another embodiment, only a wind power generator 100 according to an embodiment of the present disclosure can be disposed on the floating platform 200. Therefore, it is possible to continuously generate electric energy regardless of location and wind direction and strength.

Figure 15:
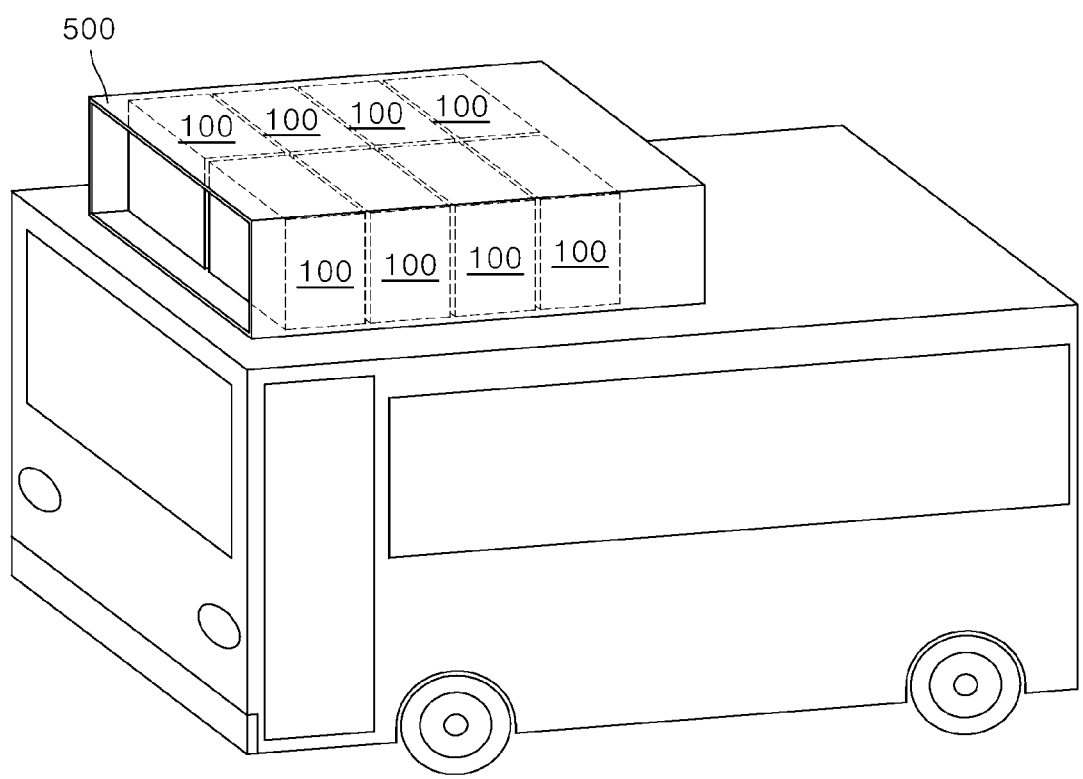
FIG. 15 shows a state in which a wind power generator using a piezoelectric element according to an embodiment of the present disclosure is installed in an electric vehicle.

FIG. 15 shows a state in which a wind power generator using a piezoelectric element according to an embodiment of the present disclosure is installed in an electric vehicle.

In one embodiment of the present disclosure, the electric vehicle has a wind power generator 100 and a ventilation tunnel 500.

In one embodiment of the present disclosure, the wind power generation device 100 and the ventilation tunnel 500 may be disposed at the top of the electric vehicle, and the ventilation tunnel 500 surrounds the wind power generation device 100. The front and rear of the ventilation tunnel 500 is open, and the other surfaces of the ventilation tunnel 500 are closed.

When the electric vehicle shown in FIG. 15 travels on a road, the wind enters the front of the ventilation tunnel 500 and the wind goes out through the rear of the ventilation tunnel 500. Accordingly, since the flow of air is generated inside the ventilation tunnel 500, the wind power generator 100 located inside the ventilation tunnel 500 can also generate electric energy using the strong flow of air.

The electric vehicle shown in FIG. 15 can travel on a road using the electric energy generated by the wind power generator 100, and since it generates electric energy independently without visiting an electric charging station, the electric charging cost is reduced.

The detailed advantageous effects according to the present disclosure as well as the aforementioned effect have described above with regard to the embodiments of the present disclosure. The present disclosure described above can be variously substituted, altered, and modified by those skilled in the art to which the present disclosure pertains without departing from the scope of the present disclosure. Therefore, the present disclosure is not limited to the above-mentioned exemplary embodiments and the accompanying drawings.

What is claimed is:

1. A wind power generator using a piezoelectric element including:
   a plurality of panels which are sequentially stacked;
   a wing-shaped piezoelectric member disposed between the plurality of panels for generating electrical energy by external force; and
   a vibrating ball container disposed on one surface of the wing-shaped piezoelectric member and including a plurality of vibrating balls,
   wherein a hole through which wind can pass is formed in at least one surface of the vibrating ball container.

2. The wind power generator of claim 1, wherein the wing-shaped piezoelectric member includes a central hole, a plurality of wings, a piezoelectric element disposed on the surface of a wing, and a wiring.

3. The wind power generator of claim 1, wherein a protrusion is formed in a lower portion of a corner of each panel, and a seating portion is formed in an upper portion of a corner of each panel.

4. The wind power generator of claim 1, wherein the vibrating ball container includes a cylindrical outer wall, a cylindrical inner wall, a lower surface, and a ring.

5. The wind power generator of claim 4, wherein the vibrating ball container includes an accommodating space formed by the cylindrical outer wall, the cylindrical inner wall and the lower surface, and
   wherein a plurality of vibrating balls are accommodated in the accommodating space.

6. The wind power generator of claim 5, wherein a plurality of holes are formed in the cylindrical outer wall or the lower surface, and
   wherein the vibrating ball vibrates by the wind passing through the plurality of holes.

7. The wind power generator of claim 1, further includes an assembly stand on which the plurality of panels, the wing-shaped piezoelectric member, and the vibrating ball are stacked.

8. The wind power generator of claim 7, wherein the assembly stand includes a support plate and a column pipe arranged in the center of the support plate.

9. The wind power generator of claim 8, wherein the column pipe includes a wiring outlet through which the wiring passes.

10. The wind power generator of claim 8, wherein the plurality of panels, the wing-shaped piezoelectric member, and the vibrating ball are stacked on an upper portion of the support plate, and
    wherein a printed circuit board to which wiring is connected is disposed inside the support plate.

11. The wind power generator of claim 8, wherein a seating portion for fixing the protrusions of the plurality of panels is formed at an upper portion of the corner of the support plate, and wherein a hole to which a bolt is fastened is formed in the center of the seating portion.

* * * * *